(12) United States Patent
Anthony et al.

(10) Patent No.: US 10,107,848 B2
(45) Date of Patent: Oct. 23, 2018

(54) PORTABLE TESTING DEVICE FOR A TRACTION MOTOR SENSOR

(71) Applicant: General Electric Company, Schenectady, NY (US)

(72) Inventors: Michael Anthony, Ridgeley, WV (US); Gerry J. Kielar, Erie, PA (US)

(73) Assignee: General Electric Company, Schenectady, NY (US)

( * ) Notice: Subject to any disclaimer, the term of this patent is extended or adjusted under 35 U.S.C. 154(b) by 298 days.

(21) Appl. No.: 15/001,814

(22) Filed: Jan. 20, 2016

(65) Prior Publication Data
US 2017/0205456 A1    Jul. 20, 2017

(51) Int. Cl.
G01R 31/02    (2006.01)
G01R 31/00    (2006.01)
G01R 31/34    (2006.01)

(52) U.S. Cl.
CPC ......... G01R 31/007 (2013.01); G01R 31/343 (2013.01)

(58) Field of Classification Search
None
See application file for complete search history.

(56) References Cited

U.S. PATENT DOCUMENTS

| | | | | |
|---|---|---|---|---|
| 5,682,826 A | * | 11/1997 | Hollenbeck | F23N 1/062 110/147 |
| 6,124,692 A | * | 9/2000 | Canada | G01R 31/343 318/490 |
| 6,581,464 B1 | * | 6/2003 | Anderson | G01P 1/026 73/493 |
| 7,873,581 B2 | | 1/2011 | Flickinger et al. | |
| 9,276,448 B2 | * | 3/2016 | Hassel | G01D 11/24 |
| 2003/0082003 A1 | * | 5/2003 | Potts | E01C 19/286 404/117 |
| 2007/0177984 A1 | * | 8/2007 | Berwanger | F04B 49/06 417/44.1 |
| 2009/0096405 A1 | | 4/2009 | Flickinger et al. | |
| 2009/0110788 A1 | * | 4/2009 | Ciancimino | A21C 1/02 426/231 |
| 2009/0195204 A1 | * | 8/2009 | Gumpert | B25D 11/00 318/460 |
| 2012/0021777 A1 | * | 1/2012 | Lazaridis | H04W 4/046 455/456.4 |
| 2012/0118086 A1 | * | 5/2012 | Horn | G01D 11/245 73/866.5 |

(Continued)

Primary Examiner — Tung X Nguyen
Assistant Examiner — Dominic Hawkins
(74) Attorney, Agent, or Firm — GE Global Patent Operation; John A. Kramer

(57) ABSTRACT

A portable testing device includes a housing that encloses an electric motor and a power source. The power source is configured to provide electrical power to the electric motor. The system also includes a sensor port operatively coupled to the housing and the electric motor. The sensor port includes a converter member that is movable to adjust a depth of the sensor port. The system also includes a user interface device operatively coupled to the housing. The user interface device is configured to adjust an amount of the electrical power provided by the power source to the electric motor. The sensor port is configured to removably receive a sensor for testing operation of the sensor relative to the electric motor.

20 Claims, 8 Drawing Sheets

(56) References Cited

U.S. PATENT DOCUMENTS

| | | | |
|---|---|---|---|
| 2013/0103119 A1* | 4/2013 | Yamanaka | A61N 1/06 607/62 |
| 2013/0214716 A1* | 8/2013 | Barfus | A47J 43/08 318/434 |
| 2014/0079564 A1* | 3/2014 | Becerra | F04D 15/0066 417/53 |
| 2014/0128049 A1* | 5/2014 | Aoki | B60K 37/02 455/418 |
| 2014/0300733 A1* | 10/2014 | Mitchell | G06K 9/00671 348/135 |
| 2015/0019266 A1* | 1/2015 | Stempora | G06Q 40/08 705/4 |
| 2015/0025917 A1* | 1/2015 | Stempora | G06Q 40/08 705/4 |
| 2015/0253817 A1* | 9/2015 | Lin | G06F 1/1694 345/156 |
| 2015/0355054 A1 | 12/2015 | Kumar et al. | |
| 2016/0126811 A1* | 5/2016 | Klode | H02K 11/215 310/68 B |

* cited by examiner

PORTABLE TESTING DEVICE FOR A TRACTION MOTOR SENSOR

FIELD

Embodiments of the subject matter disclosed herein relate to a portable testing device for troubleshooting a speed sensor of a traction vehicle.

BACKGROUND

Traction vehicles such as, for example, locomotives in a rail vehicle consist ("consist" referring to a group of vehicles linked to travel together along a route), may employ traction motors for driving wheels of the traction vehicle. During operation of the traction motors, a moving velocity and/or rotational speed of the traction vehicle may be monitored on a display by the operator of the traction vehicle. The speed is measured by one or more speed sensors and corresponding measuring circuitry, which output the measured speed on the display. The measured speed may be used to control various functions of the traction vehicle like torque production, adhesion optimization, as well as speed control.

When a speed sensor failure is detected, the failure may be caused by the speed sensor itself, the corresponding measuring circuitry, and/or the traction motor. To determine a cause of the failure, a technician tests each system to determine the component(s) causing the failure using a conventional testing system. The conventional testing system is a collection of separate pieces of large hardware such as a battery and a large electric motor. The conventional testing system weighs over sixty pounds, and is only movable while on a cart that is positioned by the technician. The weight and separated hardware of the conventional system limit where and/or how the conventional testing system can be used. Additionally, the use of the conventional testing system is limited to specific traction motors having an alternating current speed sensor.

BRIEF DESCRIPTION

In one embodiment, a system (e.g., a portable testing device) includes a housing that encloses an electric motor and a power source. The power source is configured to provide electrical power to the electric motor. The system also includes a sensor port operatively coupled to the housing and the electric motor. The sensor port includes a converter member that is movable to adjust a depth of the sensor port. The system also includes a user interface device operatively coupled to the housing. The user interface device is configured to adjust an amount of the electrical power provided by the power source to the electric motor. The sensor port is configured to removably receive a sensor for testing operation of the sensor relative to the electric motor.

In one embodiment, a system includes a portable testing device having an electric motor, a power source, a housing, and a user interface device. The power source is configured to provide electrical power to the electric motor. The electric motor and the power source are enclosed in the housing. The housing includes a sensor port and the user interface device, which is attached to the housing. The sensor port is operatively coupled to the electric motor, and is configured to removably receive a sensor for testing operation of the sensor relative to the electric motor. The sensor port includes a converter member that is configured to adjust a depth of the sensor port to establish a position of the sensor relative to the testing device when the sensor is received in the sensor port. The user interface device is configured to adjust an amount of the electrical power provided by the power source to the electric motor.

In one embodiment, a method includes moving a converter member to adjust a depth of a sensor port to receive a head of a sensor cable. A speed sensor is attached to the head of the sensor cable. The method also includes inserting the head into the sensor port to position the speed sensor to a measurement position, which is adjacent to an electric motor. The measurement position is established by the depth of the sensor port. The method further includes adjusting a speed of the electric motor by adjusting an electric power delivered to the electric motor by a power source. The electric motor and the power source are enclosed in a housing. The method also includes measuring a speed of the electric motor by the speed sensor.

BRIEF DESCRIPTION OF THE DRAWINGS

The present inventive subject matter will be better understood from reading the following description of non-limiting embodiments, with reference to the attached drawings, in which.

DETAILED DESCRIPTION

Various embodiments described herein provide a completely portable sensor testing device, such as a traction motor speed sensor (TMSS). The portable testing device may be contained in a housing powered by a rechargeable battery. The portable testing device may be carried by a technician (e.g., electrician, mechanic) proximate to a traction vehicle (e.g., propulsion-generating vehicle). In operation, the portable testing device may isolate problems pertaining to a TMSS fault and/or malfunctions. The portable testing device may be used for alternating current (AC) and direct current (DC) speed sensors, which allow the technician to use the portable testing device for additional traction vehicles relative to conventional testing systems. The portable testing device may acquire measurements from a traction motor of the traction vehicle (e.g., propulsion-generating vehicle). The portable testing device may generate a sensor measurement signal, which is received by one or more measuring circuits. The portable testing device may be used to determine which of the components (e.g., the one or more measurements circuits, the TMSS, the traction motor, and/or the like) is causing the TMSS fault and/or malfunction.

Figure 1:
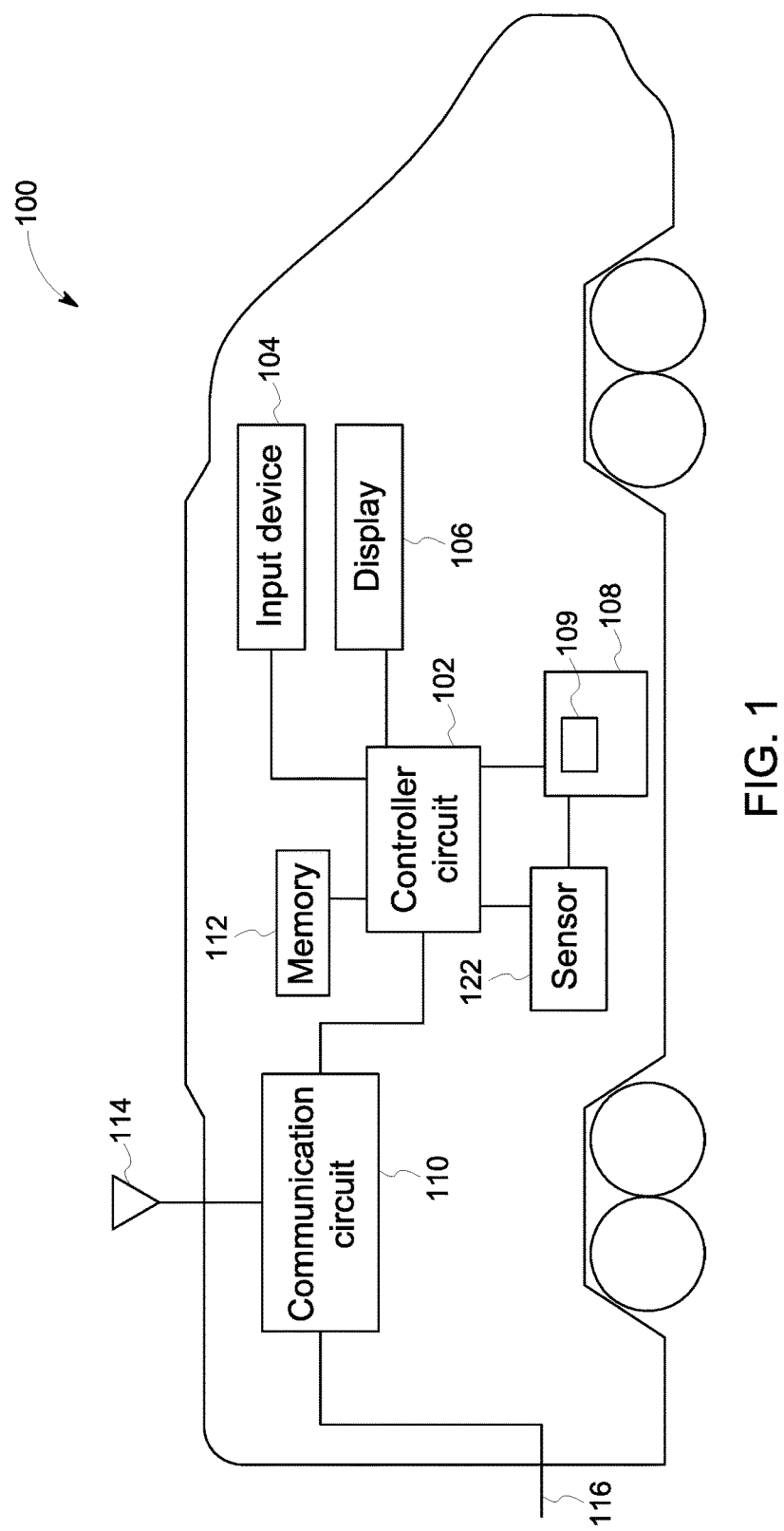
FIG. 1 is a schematic diagram of a propulsion-generating vehicle, in accordance with an embodiment.

FIG. 1 is a schematic diagram of a propulsion-generating vehicle 100, in accordance with one embodiment. The propulsion-generating vehicle 100 is shown as a locomotive. Alternatively, the propulsion-generating vehicle 100 may represent other vehicles, such as automobiles, marine vessels, and/or the like. Optionally, the propulsion-generating vehicle 100 may be coupled and/or grouped with other vehicles (e.g., alternative propulsion-generating vehicles, non-propulsion generating vehicles, rail cars, and/or the like), for example, to form a vehicle consist.

The propulsion-generating vehicle 100 includes a controller circuit 102 that controls operations of the propulsion-generating vehicle 100. The controller circuit 102 may include or represent one or more hardware circuits or circuitry that include, are connected with, or that both include and are connected with one or more processors, controllers, or other hardware logic-based devices.

The controller circuit 102 may be connected with a communication circuit 110. The communication circuit 110 may represents hardware and/or software that is used to communicate with other vehicles, dispatch stations, remote system(s), and/or the like. For example, the communication circuit 110 may include a transceiver and associated circuitry (e.g., antennas) 114 for wirelessly communicating (e.g., communicating and/or receiving) linking messages, command messages, linking confirmation messages, reply messages, retry messages, repeat messages, status messages, and/or the like. Optionally, the communication circuit 110 includes circuitry for communicating the messages over a wired connection 116, such as an electric multiple unit (eMU) line, catenary or third rail of electrically powered vehicle, or another conductive pathway between or among other vehicles coupled to the propulsion-generating vehicle 100.

The memory 112 may be may be used for storing data associated with a traction motor speed sensor (TMSS) 122, firmware or software corresponding to, for example, a graphical user interface, programmed instructions for one or more components in the propulsion-generating vehicle 100 (e.g., the controller circuit 102, the propulsion subsystem 108), and/or the like. The memory 140 may be a tangible and non-transitory computer readable medium such as flash memory, RAM, ROM, EEPROM, and/or the like.

The controller circuit 102 is connected with a propulsion subsystem 108. The propulsion subsystem 108 provides tractive effort and/or braking effort of the propulsion-generating vehicle 100. The propulsion subsystem 108 may include or represent one or more engines, one or more traction motors 109, alternators, generators, brakes, batteries, turbines, and/or the like, that operate to propel the propulsion-generating vehicle 100 under the manual or autonomous control that is implemented by the controller circuit 102. For example, the controller circuit 102 can generate control signals autonomously or based on manual input that is used to direct operations of the propulsion subsystem 108.

The TMSS 122 may monitor one or more components of the propulsion subsystem 108, such as one or more traction motors 109. Additionally or alternatively, the propulsion-generating vehicle 100 may have more than one TMSS 122. For example, each traction motor 109 may have a corresponding TMSS 122. It may be noted that the TMSS 122 may be configured as an AC sensor or a DC sensor based on characteristics of the traction motor 109. For example, for embodiments having an AC driven traction motor 109, the TMSS 122 may be configured as an AC sensor. In another example, for embodiments having a DC driven traction motor 109, the TMSS 122 may be configured as a DC sensor. The TMSS 122 may be an electro-sensor, hall-effect sensor, magnetic sensor, radar Doppler sensor, LIDAR sensor, proximity sensor, and/or the like. For example, the TMSS 122 may be positioned adjacent to and/or approximate to a rotor of the traction motor 109. The TMSS 122 may measure one or more characteristics of the traction motor 109, which are associated with a rotational speed (e.g., of the rotor of the traction motor 109, of wheels of the propulsion-generating vehicle 100, and/or the like) and/or moving velocity of the propulsion-generating vehicle 100. For example, the TMSS 122 may measure a rotational speed of the rotor of the traction motor 109.

Figure 4A:
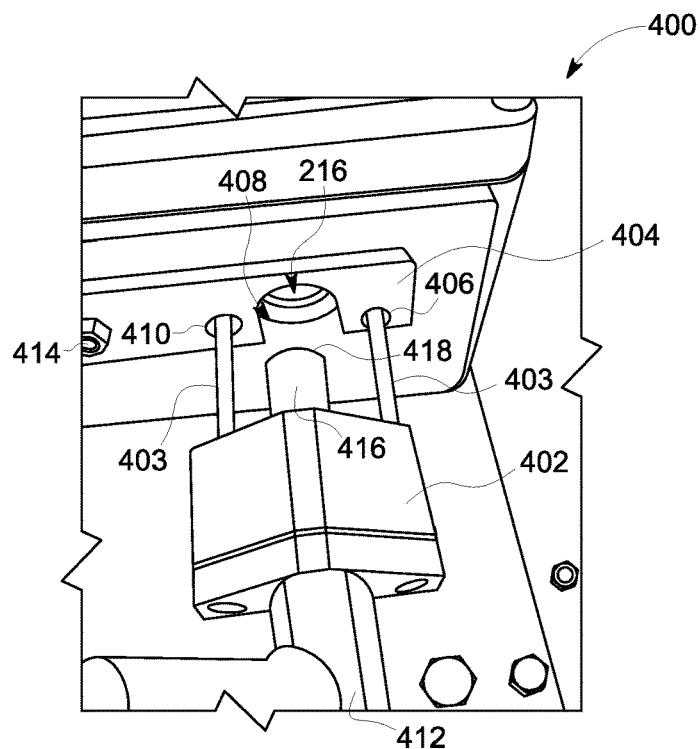
FIGS. 4A-4B are perspective views of a sensor port of the traction motor speed sensor testing device shown in FIG. 2, in accordance with an embodiment.
Figure 4B:
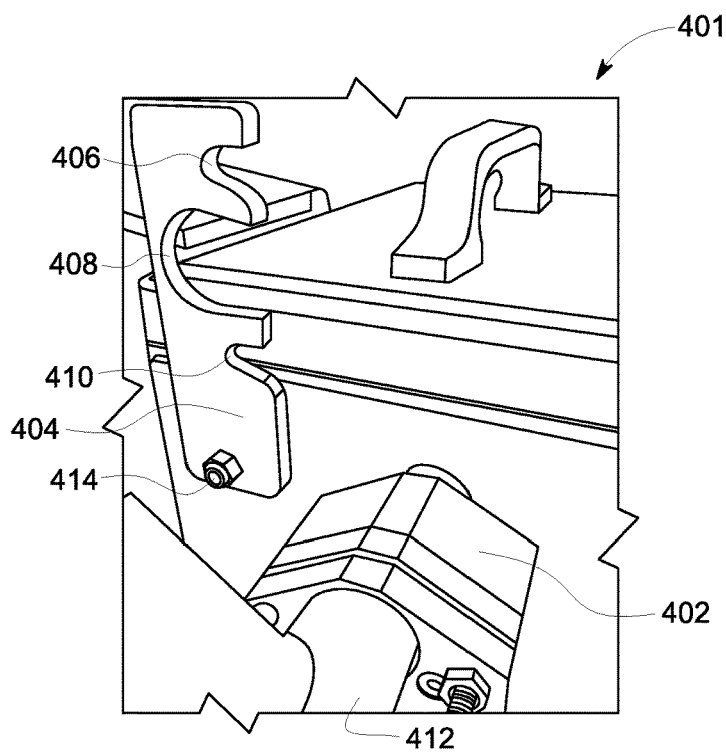

The TMSS 122 may generate a sensor measurement signal, which is received and/or acquired by measuring circuitry of the controller circuit 102 via a sensor cable (e.g., the sensor cable 412 shown in FIGS. 4A-B). For example, the measuring circuitry may include one or more filters, amplifiers, analog to digital converters, and/or the like. The sensor measurement signal may have an alternating current (AC) or direct current (DC) with one or more electrical characteristics representing a speed. For example, the electrical characteristic may be a voltage, a current, amplitude, frequency, phase, and/or the like. Based on the one or more electrical characteristics of the sensor measurement signal, the controller circuit 102 may determine a speed of the traction motor 109 and/or generally the propulsion-generating vehicle 100.

The controller circuit 102 may be connected to an input device 104 and the display 106. The controller circuit 102 can receive manual input from an operator of the propulsion-generating vehicle 100 through the input device 104, such as a keyboard, touchscreen, electronic mouse, microphone, or the like. For example, the controller circuit 102 can receive manually input changes to the tractive effort, braking effort, speed, power output, and the like, from the input device 104.

The display 106 may include one or more liquid crystal displays (e.g., light emitting diode (LED) backlight), organic light emitting diode (OLED) displays, plasma displays, CRT displays, and/or the like. For example, the controller circuit 102 can present the status and/or details of the vehicle system 102 (e.g., speed), faults/alarms, contents of one or more command messages, and/or the like. Optionally, the display 204 may be a touchscreen display, which includes at least a portion of the input device 104.

A portion of the input device 104 may interact with a graphical user interface (GUI) generated by the controller circuit 102, which is shown on the display 106. For example, the GUI may display information associated with an operational status of the propulsion-generating vehicle 100. The GUI may include one or more operation indicators such as gauges, meters, numerical values, warning indicators, graphical indicators, and/or the like. For example, the GUI may include a numerical value corresponding to a speed of the propulsion-generating vehicle 100 based on the sensor measurement signal generated by the TMSS 122.

Optionally, the controller circuit 102 may detect a malfunction and/or error occurs during operation of the propulsion subsystem 108 and/or the propulsion-generating vehicle 100. For example, the controller circuit 102 may detect a malfunction of the TMSS 122 by comparing the one or more electrical characteristics of the sensor measurement signal with one or more operational thresholds stored in the memory 112. Optionally, when a malfunction and/or error is detected, the controller circuit 102 may identify a fault/alarm and display a notification on a display 106.

Additionally or alternatively, the controller circuit 102 may transmit the detected malfunction to a remote system (e.g., dispatch station, repair facility, inspection center) along a communication link established by the communication circuit 110. For example, the controller circuit 102 may automatically communicate the detected malfunction to a dispatch station via the communication link. Optionally, the controller circuit 102 may automatically include an inspection request. For example, the controller circuit 102 may automatically schedule an inspection of the TMSS 122, the traction motor 109, and/or the controller circuit 102.

Figure 2:
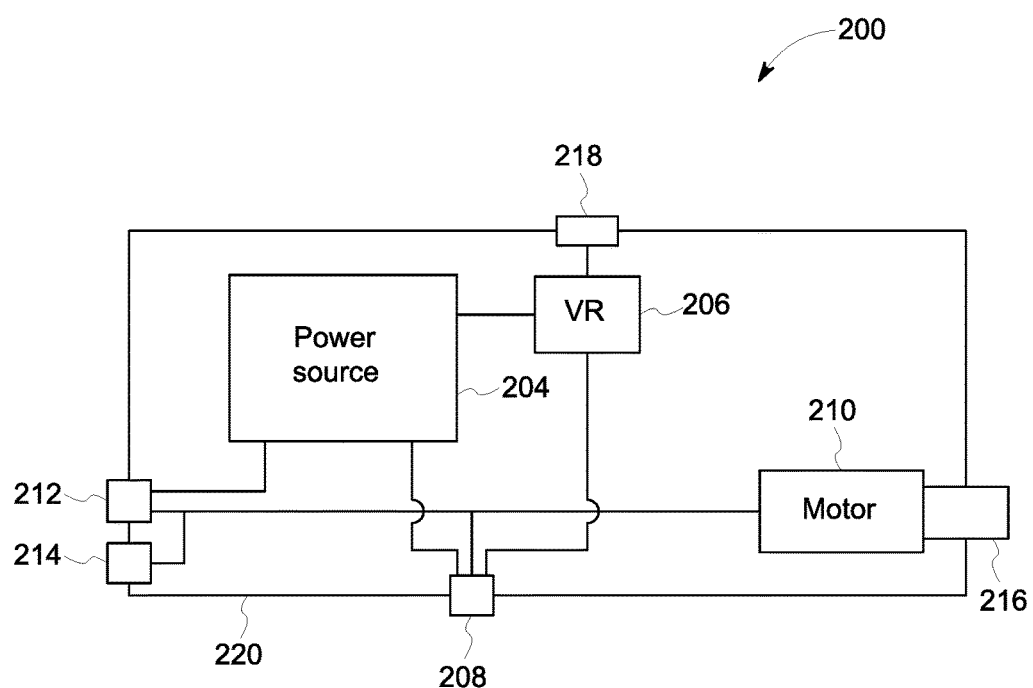
FIG. 2 is a schematic diagram of a traction motor speed sensor testing device; in accordance with an embodiment.

In connection with FIG. 2, a portable TMSS (or other sensor) testing device 200 may be used during the inspection and/or to troubleshoot or perform diagnostics to determine a cause of the TMSS (or other sensor) fault and/or malfunction.

FIG. 2 illustrates a schematic diagram of an embodiment of the portable TMSS testing device 200, which includes a power source 204, an electric motor 210, and a user interface device 212. These components of the portable TMSS testing device 200 may be contained within a housing 220 of the testing device. The housing 220 may be composed of metal, plastic, fiberglass, and/or the like. The housing 220 (and components contained therein and/or attached thereto) may be configured to allow the portable TMSS testing device 200 to be portable (e.g., hand carried by the operator). For example, TMSS testing device 200 may have a weight of less than 20 pounds. In one aspect, the portable TMSS testing device 200 may weigh approximately 13 pounds or 6 kilograms. The housing 220 may include one or more ports. The one or more ports may include various interface structures/components and/or an opening, gap, and/or the like, which allow the operator to connect remote systems (e.g., external power source, sensor cable 412 shown in FIGS. 4A-B) to the portable TMSS testing device 200 and/or one or more components of the portable TMSS testing device 200. For example, the housing 220 may include a power port 218 for receiving an AC signal from an external power source. In another example, the housing 220 may include a sensor port 216 for connecting a sensor to the portable TMSS testing device 200. The sensor port 216 may be adjacent to and/or proximate to a rotor of the electric motor 210 of the portable TMSS testing device 200. The sensor port 216 may be configured to removably receive a sensor (e.g., the TMSS 122) for testing operation of the sensor relative to the electric motor 210. For example, the TMSS 122 may be positioned into the sensor port 216. In another example, the TMSS 122 may be removed from the sensor port 216.

The electric motor 210 may be a DC motor, such as a servo motor, a brushed DC electric motor, a brushless DC electric motor, and/or the like. The electric motor 210 may be configured as a high speed motor. For example, the electric motor 210 may be configured to generate a rotational velocity of a rotor at speeds of more than 20 miles per hour (e.g., 25 MPH, 30 MPH, 40 MPH, and/or the like). The electric motor 210 may be connected to the power source 204, which is configured to supply and/or provide electrical power to the electric motor 210. The speed of the motor, such as the rotational speed of the rotor, may be based on an amount of voltage and/or current delivered to the electric motor 210 by the power source 204. For example, the electric motor 210 may have a higher speed relative to alternative DC motors 210 receiving a lower voltage and/or current relative to the electric motor 210.

The power source 204 may be a rechargeable battery, such as a lithium ion battery, a lead-acid battery, a nickel metal hydride battery, and/or the like. For example, the power source 204 may be a 12 V rechargeable battery. The power source 204 may be connected to a voltage regulator 206. The voltage regulator 206 may be configured to provide a charge current and/or voltage to the power source 204. For example, the voltage regulator 206 may receive an AC signal from the power port 218 connected to the voltage regulator 206. The voltage regulator 206 may include one or more inverters or rectifiers to convert the AC signal to a DC voltage to charge the power source 204.

Additionally or alternatively, the voltage regulator 206 may electrically couple the power port 218 to the electric motor 210. For example, the voltage regulator 206 may receive an AC signal from the power port 218. The voltage regulator 206 may convert the AC signal to a DC signal which is received by the electric motor 210.

Figure 3:
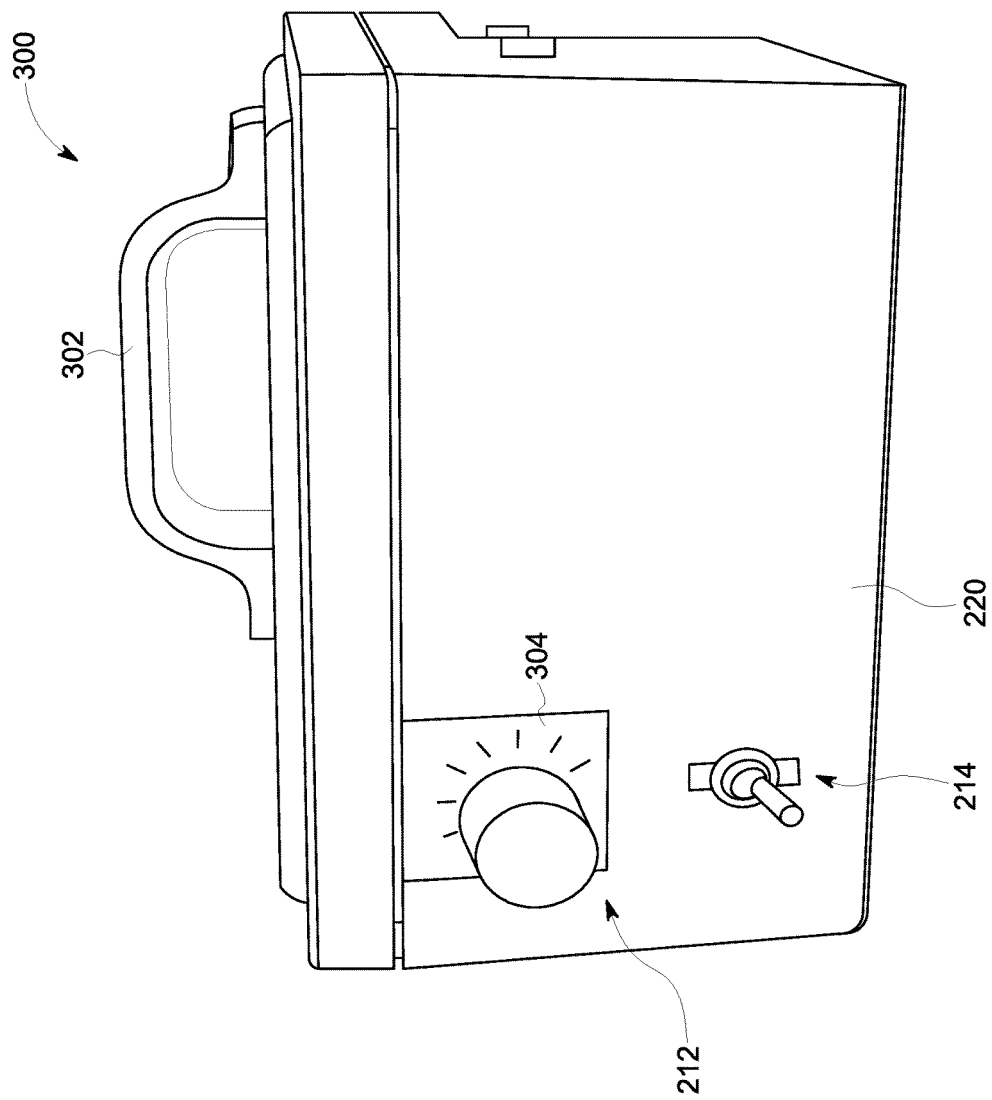
FIG. 3 is a perspective view of the traction motor speed sensor testing device shown in FIG. 2.

An amount of electrical power provided to the electric motor 210 by the power source 204 and/or the voltage regulator 206 may be based on an adjustable setting of the user interface device 212, that is, the setting to which the user interface device is currently adjusted forms the basis for how much power is provided to the motor. The user interface device 212 may include one or more tactile buttons, a trackpad, keyboard, rotatable dial (e.g., as shown in FIG. 3), and/or the like, which are mounted to and/or on a surface of the housing 220. In one aspect, the user interface device 212 may correspond to a rotatable dial corresponding to a contact of a potentiometer that electrically couples the power source 204 to the electric motor 210. The rotatable dial adjusts an impedance of an output of the potentiometer, which affects the speed delivered by the electric motor 210. For example, the amount of voltage and/or current (e.g., electrical power) delivered to the motor 210 is adjusted by the potentiometer. A speed of the electric motor 210 (e.g., the rotational speed of the rotor) is based on the amount of voltage and/or current received by the power source 204. For example, the speed of the electric motor 210 may be higher relative to another embodiment of the electric motor 210 receiving a lower voltage and/or current.

The portable TMSS testing device 200 may also include a switch 214 (e.g., relay, toggle switch, mechanical switch, and/or the like) mounted to and/or on a surface of the housing 220. The switch 214 may be a user interface component that can be positioned in an 'ON' (e.g., powered) position and an 'OFF' position. In one aspect, the switch 214 may activate or deactivate the portable TMSS testing device 200. In operation, the 'ON' position may electrically couple the electric motor 210 to the power source 204, and the 'OFF' position may electrically disconnect the electric motor 210 from the power source 204.

The portable TMSS testing device 200 may include a display 208 mounted to and/or on a surface of the housing 220. The display 208 may be an array of LEDs, a segment display, an LCD display, and/or the like. The display 208 may display information that includes information (e.g., charging power source 204, power source 204 needs to be charged, the electric motor 210 is powered, and/or the like) of one or more components of the portable TMSS testing device 200. For example, the display 208 may include an array of LEDs. Each LED corresponding to a component status of the portable TMSS testing device 200. For example, one of the LEDs is activated when the voltage regulator 206 is charging the power source 204. In another example, one of the LEDs is activated when the switch 214 is in the 'ON' position. In another example, one of the LEDs is activated when the electric motor 210 receives a voltage and/or current from the voltage regulator 206.

FIG. 3 illustrates a perspective view 300 of the portable TMSS testing device 200, in accordance with an embodiment. Optionally, as shown in FIG. 3, the housing 220 may include an attachment such as a handle 302. The attachment may be configured to allow the operator to carry and/or move the portable TMSS testing device 200. The user interface device 212 is shown as a rotatable dial. It may be noted that in other embodiments, the user interface 212 may be a keypad, a plurality of tactile buttons, a touch panel, and/or the like. Optionally, a position indicator 304 may be adjacent to the user interface device 212. In one aspect, the position indicator 304 may indicate the relationship between the user interface device 212 and a speed of the electric motor 210. For example, the position indicator 304 may include one or more graphical indicia (e.g., icons, colors, numeral values) corresponding to candidate positions of the user interface device 212. Each candidate position may correspond to a unique speed of the electric motor 210. When the user interface device 212 is positioned at one of the candidate positions, an amount of voltage and/or current is delivered to the electric motor 210 (e.g., by the power source 204, by the voltage regulator 206) to generate the unique speed of the electric motor 210.

FIGS. 4A and 4B illustrate perspective views 400-401 of the sensor port 216 of the portable TMSS testing device 200, in accordance with an embodiment. The sensor port 216 may include a converter member 404. The converter member 404 is shown having an elongated shape, such as a bar. However, it may be noted that the converter member 404 may have different shapes in other embodiments (e.g., converter member 504, converter member 604). The converter member 404 may be configured to adjust a depth of the sensor port 216 for a head 402 of a sensor cable 412. The head 402 may enclose the TMSS 122. The depth of the sensor port 216 may extend from a surface of the housing 220 to a measurement position for the electric motor 210. The converter member 404 may extend the depth of the sensor port 216 by increasing a thickness of the housing 220 around and/or proximate to the sensor port 216. The depth of the sensor ports 216 is configured to be adjusted (e.g., by the converter member 404) to establish a position (e.g., the measurement position) of the TMSS 122 relative to the TMSS testing device 200 when the head 402 of the sensor cable 412 is received in the sensor port 216. The measurement position may correspond to a location of the TMSS 122 at a distal end 418 of a sensor peg 416 within the portable TMSS testing device 200. For example, the measurement position may be based on a position of the rotor of the electric motor 210 with respect to the TMSS 122. At the measurement position, the TMSS 122 may be able to measure a speed of the electric motor 210.

The converter member 404 may be movable to adjust a depth of the sensor port. For example, as illustrated in FIGS. 4A and 4B, the converter member 404 may pivot about a pivot point 414, which connects the converter member 404 to the housing 220. The pivot point 414 enables the converter member 404 to rotate around the pivot point 414 from a down position (e.g., as shown in FIG. 4A) to an up position (e.g., as shown in FIG. 4B), and vice versa. Each position may allow the portable TMSS testing device 200 to connect to different types of TMSS 122 that have different sensor peg 416 lengths. When the converter member 404 is at the down position, the depth of the sensor port 216 may be larger than when the converter member 404 is at the up position. The different depths allow heads 402 with varying sensor peg 416 lengths to be inserted into the sensor port 216, while still positioning the TMSS 122 in either case at a position to measure motor speed.

The head 402 of the sensor cable 412 may include a pair of mounting studs 403 and/or the central peg 416, as shown in FIG. 4A. The converter member 404 may include a series of notches 406, 408, 410. In one aspect, the series of notches 406, 408, 410 are configured to receive the head 402 of the sensor cable 412. The notches 406, 408, 410 may be spaced apart from each other and/or positioned to match the mounting studs 403 and the central peg 416. For example, the notches 406, 408, 410 may be positioned on the converter member 404 to allow the mounting studs 403 and the central peg 416 to pass through and/or traverse the converter member 404 to the housing 220. In other embodiments, the converter member (e.g., the converter member 504, the converter member 604) includes a series of holes that are dimensioned similarly to the notches, in terms of allowing the studs 403 and peg 416 to pass through the converter member.

The TMSS 122 may be located within the central peg 416. For example, the TMSS 122 may acquire measurements of a speed of the electric motor 210 and/or the traction motor 109 when the distal end 418 is positioned proximate to the rotor of the electric motor 210. The size of the central peg 416 may be based on the TMSS 122. For example, the central peg 416 for the TMSS 122 configured as an AC sensor may be longer relative to the central peg 416 for the TMSS 122 configured as a DC sensor.

It may be noted that a position of the converter member 404 and thereby the depth of the sensor port 216 may be based on the TMSS 122. For example, based on the configuration of the TMSS 122 being an AC sensor or DC sensor. In operation, when the TMSS 122 is configured as an AC sensor the converter member 404 may be positioned in the down position, as shown in FIG. 4A, to extend the depth of the sensor port 216 for the central peg 416 to a first depth length. Alternatively, when the TMSS 122 is configured as a DC sensor the converter member 404 may be positioned in the up position, as shown in FIG. 4B, to have the depth of the sensor port 216 be at a second depth length. It may be noted that in at least one embodiment the converter member 404 may be positioned up for the TMSS 122 configured as an AC sensor.

It may be noted that the converter member 404 may have a different shape in various other embodiments relative to the converter member 404 shown in FIG. 4. For example, in connection with FIGS. 5A-5B, a converter member 504 may have a circular shape. In another example, in connection with FIGS. 6A-6B, a converter member 605 may have a square or rectangular shape.

Figure 5A:
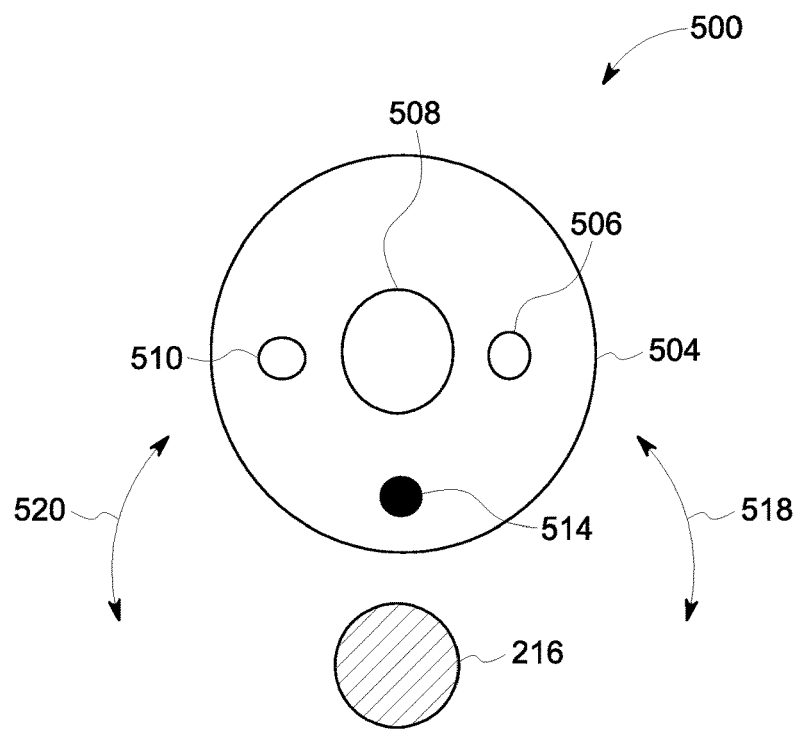
FIGS. 5A-5B are perspective views of a sensor port of the traction motor speed sensor testing device shown in FIG. 2, in accordance with an embodiment.
Figure 5B:
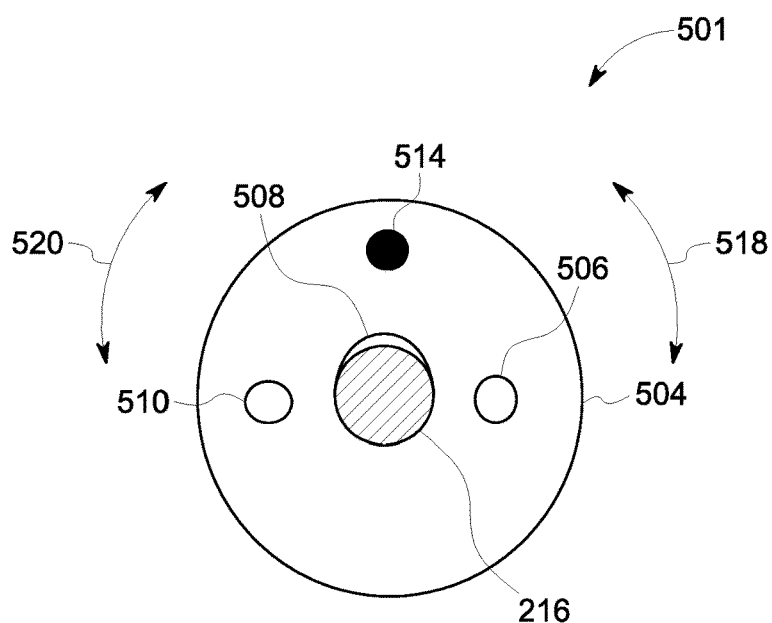

FIGS. 5A-5B illustrate views 500-501 of the sensor port 216 of the portable TMSS testing device 200, in accordance with an embodiment. The sensor port 216 includes the converter member 504 having a circular shape. Similar to the converter member 404 shown in FIG. 4, the converter member 504 may be configured to adjust a depth of the sensor port 216 for a head of a sensor cable. The converter member 504 may extend the depth of the sensor port 216 by increasing a thickness of the housing 220 around and/or proximate to the sensor port 216. The converter member 504 may be movable to adjust a depth of the sensor port around a pivot point 514. For example, the converter member 504 may rotate about the pivot point 514 in a direction of arrows 518, 520. Optionally, the pivot point 514 may connect the converter member 504 to the housing 220. The pivot point 514 enables the converter member 504 to rotate around the pivot point 514 from a down position (e.g., as shown in FIG. 5B) to an up position (e.g., as shown in FIG. 5A), and vice versa. Each position may allow the portable TMSS testing device 200 to connect to different types of TMSS 122 that have different sensor peg 416 lengths as shown in FIG. 4A. When the converter member 504 is at the down position, the depth of the sensor port 216 may be larger than when the converter member 504 is at the up position. The different depths allow heads 402 with varying sensor peg 416 lengths to be inserted into the sensor port 216, while still positioning the TMSS 122 in either case at a position to measure motor speed.

Similar to the converter member 404, the converter member 504 may include a series of holes, voids, or apertures 506, 508, 510 configured to receive the head 402 of the sensor cable. The apertures 506, 508, 510 may be spaced apart from each other and/or positioned to match the mounting studs 403 and the central peg 416 of the head 402 of the sensor cable (shown in FIG. 4). For example, the apertures 506, 508, 510 may be positioned on the converter member 504 to correspond to positioned of the mounting studs 403 and the central peg 416, and allow the mounting studs 403 and the central peg 416 to pass through and/or traverse the converter member 504 to the housing 220.

Figure 6A:
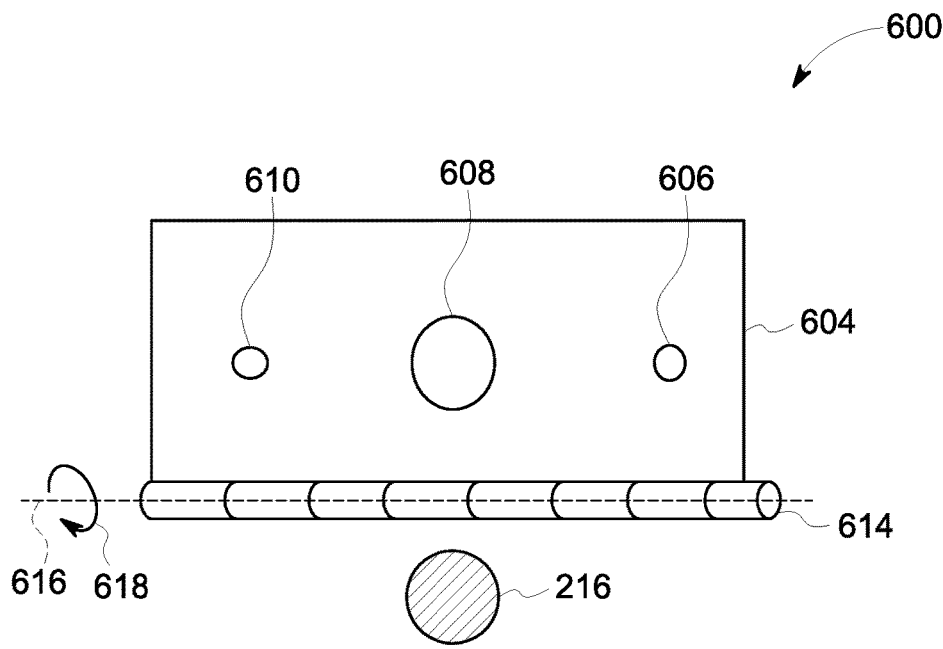
FIGS. 6A-6B are perspective views of a sensor port of the traction motor speed sensor testing device shown in FIG. 2, in accordance with an embodiment.
Figure 6B:
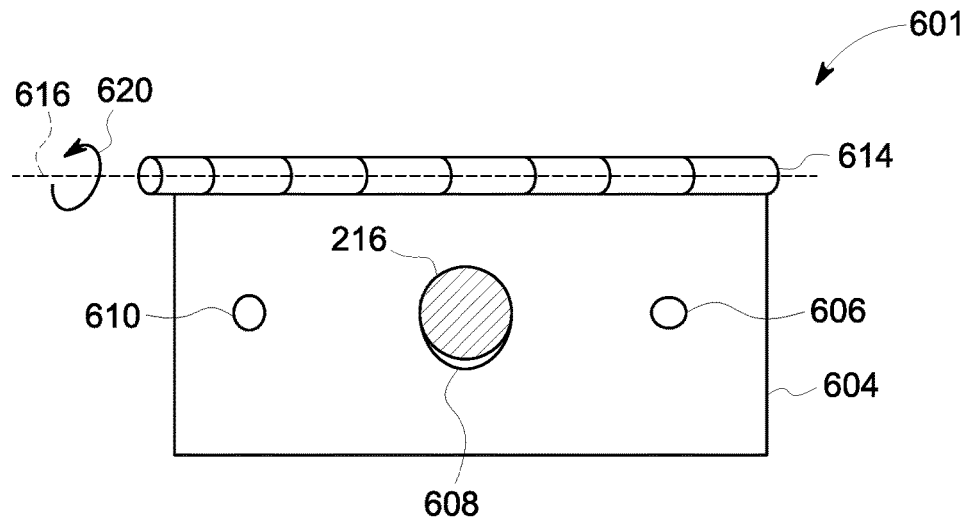

FIGS. 6A-6B illustrate views 600-601 of the sensor port 216 of the portable TMSS testing device 200, in accordance with an embodiment. The sensor port 216 includes the converter member 604 having a square or rectangular shape. Similar to the converter member 404 shown in FIG. 4, the converter member 604 may be configured to adjust a depth of the sensor port 216 for a head of a sensor cable. The converter member 604 may extend the depth of the sensor port 216 by increasing a thickness of the housing 220 around and/or proximate to the sensor port 216. The converter member 604 may be movable to adjust a depth of the sensor port around a hinge or pivot 614. For example, the converter member 604 may rotate about an axis 616 of the pivot 614 in a direction of arrows 618, 620. Optionally, the pivot 614 may connect the converter member 604 to the housing 220. The pivot 614 enables the converter member 604 to rotate around the pivot 614 from a down position (e.g., as shown in FIG. 6B) to an up position (e.g., as shown in FIG. 6A), and vice versa. Each position may allow the portable TMSS testing device 200 to connect to different types of TMSS 122 that have different sensor peg 416 lengths as shown in FIG. 4A. When the converter member 604 is at the down position, the depth of the sensor port 216 may be larger than when the converter member 604 is at the up position. The different depths allow heads 402 with varying sensor peg 416 lengths to be inserted into the sensor port 216, while still positioning the TMSS 122 in either case at a position to measure motor speed.

Similar to the converter member 504, the converter member 604 may include a series of holes, voids, or apertures 606, 608, 610 configured to receive the head 402 of the sensor cable. The apertures 606, 68, 610 may be spaced apart from each other and/or positioned to match the mounting studs 403 and the central peg 416 of the head 402 of the sensor cable (shown in FIG. 4). For example, the apertures 606, 608, 610 may be configured to allow the mounting studs 403 and the central peg 416 to pass through and/or traverse the converter member 604 to the housing 220.

Figure 7A:
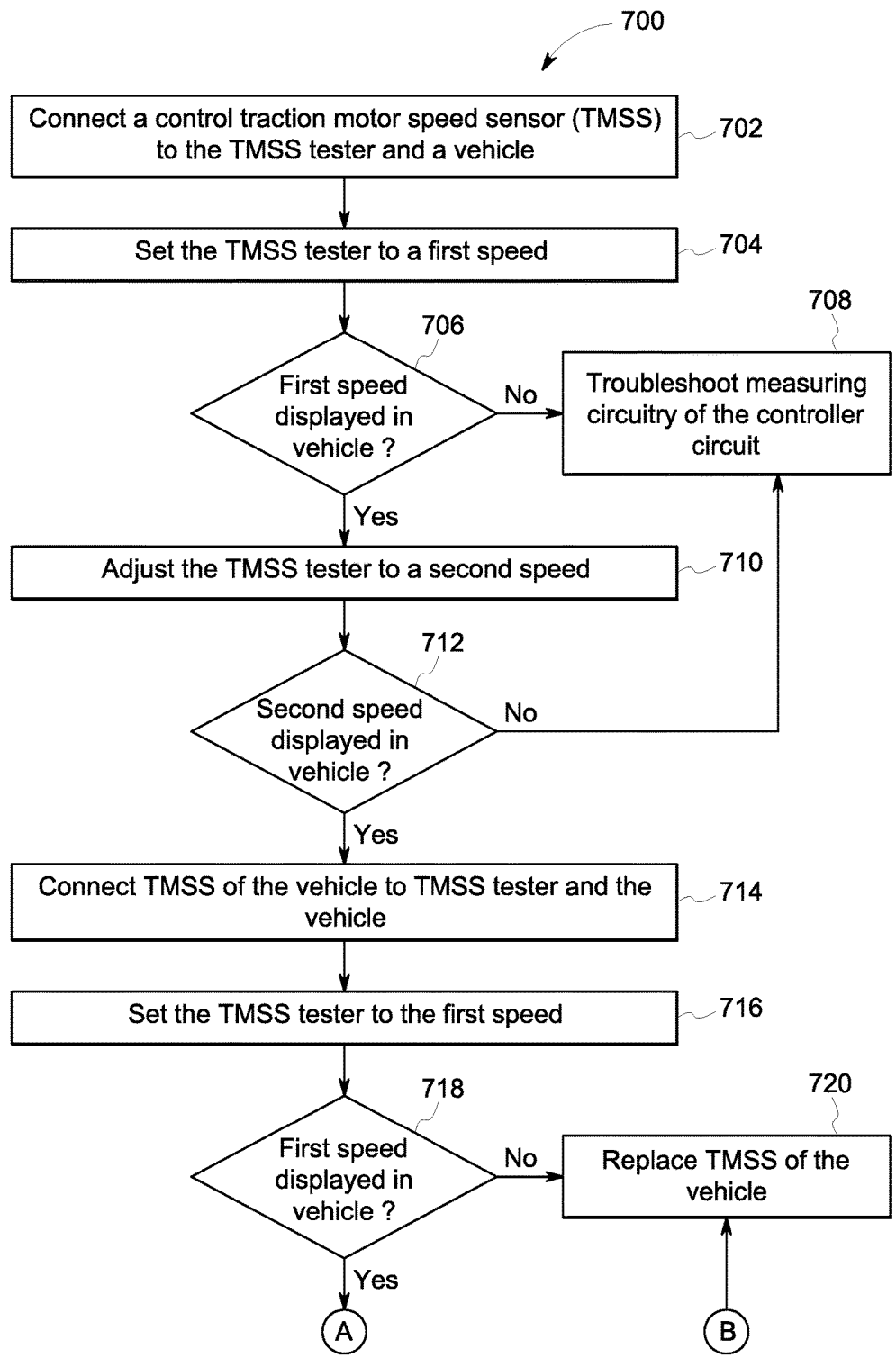
FIGS. 7A-B illustrate a flowchart of a method for using the traction motor speed sensor testing device, in accordance with an embodiment.
Figure 7B:
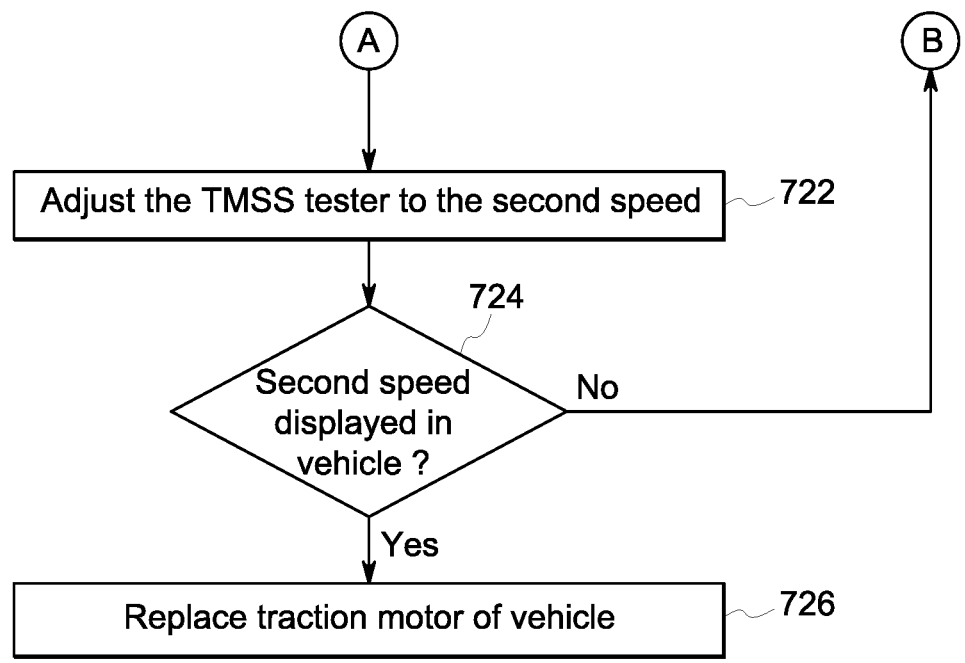

In connection with FIGS. 7A-B, the portable TMSS testing device 200 may be used to determine at least one of the components causing the TMSS fault and/or malfunction of the propulsion-generating vehicle 100. For example, the TMSS fault and/or malfunction may be caused by the TMSS 122, the measuring circuitry of the controller circuit 102, or the traction motor 109 not operating or functioning correctly. The portable TMSS testing device 200 may be used, according to the method 700 shown in FIG. 7 to test individual components and isolate the component causing the TMSS fault and/or malfunction.

FIGS. 7A-B illustrate a flowchart of the method 700 for using a TMSS testing device, in accordance with an embodiment. The method 700, for example, may employ or be performed by structures or aspects of various embodiments (e.g., systems and/or methods) discussed herein, such as the portable TMSS testing device 200. In various embodiments, certain operations may be omitted or added, certain operations may be combined, certain operations may be performed simultaneously, certain operations may be performed concurrently, certain operations may be split into multiple operations, certain operations may be performed in a different order, or certain operations or series of operations may be re-performed in an iterative fashion.

At 702, a control TMSS may be connected to the portable TMSS testing device 200 and the propulsion-generating vehicle 100. For example, the control TMSS may be the same as and/or identical to the TMSS 122 of FIG. 1. The control TMSS may be a TMSS known by the operator to operate and/or function correctly. For example, the control TMSS may generate a sensor measurement signal corresponding to a speed of the traction motor 109 or the electric motor 210 measured by the control TMSS. The control TMSS may be connected to the measuring circuitry of the controller circuit 102 of the propulsion-generating vehicle 100. For example, the sensor cable 412 of the TMSS 122 may be disconnected from the measuring circuitry, and replaced by a sensor cable of the control TMSS.

The control TMSS may be connected to the portable TMSS testing device 200 via the sensor port 216, by positioning the control TMSS in the measurement position within the portable TMSS testing device 200. For example, at the measurement position the control TMSS is positioned adjacent to and/or proximate to the rotor of the electric motor 210. The converting bar 204 may be positioned based on the control TMSS. For example, if the control TMSS is configured as an AC sensor, the converter member 404 may be positioned in the down position, as shown in FIG. 4A. Alternatively, when the control TMSS is configured as a DC sensor, the converter member 404 may be positioned in the up position, as shown in FIG. 4B.

At 704, the portable TMSS testing device 200 may be set to a first speed. In operation, the operator may adjust the user interface device 212 to set the portable TMSS testing device 200. For example, the user interface device 212 may be a rotatable dial, which adjusts an amount of voltage and/or current supplied to the electric motor 210 based on a rotational position of the rotatable dial. In one aspect, the first speed may correspond to a midway and/or halfway position of the rotatable dial.

At 706, the controller circuit 102 may determine whether the first speed is displayed in the propulsion-generating vehicle. In operation, the control TMSS may measure a speed of the electric motor 210, and generate a sensor measurement signal. The sensor measurement signal may have one or more electrical characteristics (e.g., voltage, current, amplitude, frequency, phase, and/or the like) representing the measured speed of the electric motor 210. The sensor measurement signal may be received by the measuring circuitry of the controller circuit 102 via the sensor cable. Based on the one or more electrical characteristics of the sensor measurement signal, the controller circuit 102 may determine a speed of the electric motor 210, and display the speed on the display 106. For example, the controller circuit 102 may display a numerical value corresponding to the speed of the electric motor 210 based on the sensor measurement signal generated by the control TMSS.

The controller circuit 102 may determine whether the speed on the display 106 is approximately the same as and/or within a predetermined threshold with the first speed. In one aspect, the controller circuit 102 may receive the first speed while in an inspection and/or verification mode. For example, the controller circuit 106 may receive a selection from the input device 104 corresponding to one or more interface components of a GUI shown on the display 106. The one or more interface components may be selected by the operator corresponding to the inspection and/or verification mode. The inspection and/or verification mode may include a plurality of candidate TMSS with corresponding speed values. For example, each of the candidate TMSS may include a pair of corresponding speeds (e.g., the first speed, a second speed) stored in the memory 112. In one aspect, the operator may select one of the candidate TMSS using the input device 104.

Optionally, each candidate TMSS may be a configuration of the TMSS either as an AC sensor or DC sensor. For example, one of the candidate TMSS may be a TMSS configured as an AC sensor, having a first speed ranging from 10-15 MPH and a second speed ranging from 20-30 MPH. In another example, a candidate TMSS may be a TMSS configured as a DC sensor, having a first speed ranging from 30-40 MPH and a second speed ranging from 60-70 MPH. It may be noted that one or more of the candidate TMSS may have a first speed and/or a second speed that include speeds less than 10 MPH and/or greater than 70 MPH. Additionally or alternatively, at least one of the first speed or second speed may be a single value. Optionally, the ranges of the first speed and/or the second speed may include a predetermined threshold value.

When in the inspection and/or verification mode, the controller circuit 102 may compare the speed based on the sensor measurement signal generated by the control TMSS with the first speed. The controller circuit 102 may generate a display indicator based on the measured speed of the electric motor 210. For example, the controller circuit 102 may display a flashing indicator when the measured speed of the electric motor 210 is not the same and/or approximate to (e.g., within a predetermined threshold) the first speed.

Optionally, the portable TMSS testing device 200 may simulate vibrations and/or motion of the propulsion-generating vehicle 100 by continually changing and/or shifting a position of the portable TMSS testing device 200 with respect to the propulsion-generating vehicle 100. In one aspect, by continually changing the position of the portable TMSS testing device 200 intermittent connections between the control TMSS and the propulsion-generating vehicle 100 may be identified. For example, the operator may adjust a position of the portable TMSS testing device 200 while the control TMSS is generating the sensor measurement signal. In one aspect, the operator may lift the portable TMSS testing device 200 using the handle 300 and shake and/or vibrate the portable TMSS testing device 200. The change in positions of the portable TMSS testing device 200 may adjust the position of the control TMSS with the electric motor 210, put stress on the connections of the sensor cable between the control TMSS and/or the measuring circuitry, and/or the like, which may affect the sensor measurement signal. For example, when changing the position of the portable TMSS testing device 200 the one or more electrical characteristics of the sensor measurement signal may change. The changes in the sensor measurement signal may change the speed displayed on the display 106 and/or the display indicators generated by the controller circuit 102.

If the first speed is displayed, then at 710, the portable TMSS testing device 200 is adjusted to a second speed. In operation, the operator may adjust the user interface device 212 to set the portable TMSS testing device 200 to the second speed. For example, the operator may adjust a rotational position of the user interface device 212 to a maximum speed of the portable TMSS testing device 200. In one aspect, the maximum speed may be a rotational position of the dial rotatable corresponding to an unadjusted voltage and/or current supplied to the electric motor 210 from the power source 204 or voltage regulator 206. For example, the power source 204 may correspond to a 12 V rechargeable battery. When the user interface device 212 is adjusted to the maximum speed (e.g., the second speed), the electric motor 210 is supplied approximately 12 V from the power source 204.

At 712, the controller circuit 102 may determine whether the second speed is displayed in the propulsion-generating vehicle 100. In operation, the control TMSS may generate a sensor measurement signal having one or more electrical characteristics (e.g., voltage, current, amplitude, frequency, phase, and/or the like) representing the measured speed of the electric motor 210. The sensor measurement signal may be received by the measuring circuitry of the controller circuit 102 via the sensor cable. Based on the one or more electrical characteristics of the sensor measurement signal, the controller circuit 102 may determine a speed of the electric motor 210, and display the speed on the display 106. For example, the controller circuit 102 may display a numerical value corresponding to the speed of the electric motor 210 based on the sensor measurement signal generated by the control TMSS.

The controller circuit 102 may determine whether the speed on the display 106 is approximately the same as and/or within a predetermined threshold with the second speed. For example, the controller circuit 102 may compare the second speed with the speed based on the sensor measurement signal generated by the control TMSS. The controller circuit 102 may generate a display indicator based on the measured speed of the electric motor 210. For example, the controller circuit 102 may display a flashing indicator when the measured speed of the electric motor 210 is not the same and/or approximate to (e.g., within a predetermined threshold) the second speed.

If the first speed or the second speed was not displayed, then at 708 the measuring circuitry of the controller circuit 102 can be troubleshoot (e.g., by the technician) to determine the cause of the TMSS fault and/or malfunction. For example, since the control TMSS is known to operate and/or function correctly, the measuring circuitry of the controller circuit 102 is a variable component. Thereby, the measuring circuitry of the controller circuit 102 may be determined to be the cause of the TMSS fault and/or malfunction.

At 714, the TMSS 122 may be connected to the portable TMSS testing device 200 and the propulsion-generating vehicle 100. For example, the TMSS 122 may be connected to the measuring circuitry of the controller circuit 102 of the propulsion-generating vehicle 100. For example, the sensor cable 412 of the TMSS 122 may be connected and/or coupled to the measuring circuitry. The TMSS 122 may be connected to the portable TMSS testing device 200 via the sensor port 216, by positioning the TMSS 122 in the measurement position within the portable TMSS testing device 200. For example, the TMSS 122 is positioned adjacent to and/or proximate to the rotor of the electric motor 210. The converting bar 204 may be positioned based on the TMSS 122. For example, if the TMSS 122 is configured as an AC sensor, the converter member 404 may be positioned in the down position, as shown in FIG. 4A. Alternatively, when the TMSS 122 is configured as a DC sensor, the converter member 404 may be positioned in the up position, as shown in FIG. 4B.

At 716, the portable TMSS testing device 200 may be set to the first speed. In operation, the operator may adjust the user interface device 212 to set the portable TMSS testing device 200 to the first speed. For example, the user interface device 212 may be a rotatable dial, which adjusts an amount of voltage and/or current supplied to the electric motor 210 based on a rotational position of the rotatable dial. In one aspect, the first speed may correspond to a midway and/or halfway position of the rotatable dial.

At 718, the controller circuit 102 may determine whether the first speed is displayed in the propulsion-generating vehicle. In operation, the TMSS 122 may generate a sensor measurement signal having one or more electrical characteristics (e.g., voltage, current, amplitude, frequency, phase, and/or the like) representing the measured speed of the electric motor 210. The sensor measurement signal may be received by the measuring circuitry of the controller circuit 102 via the sensor cable 412. Based on the one or more electrical characteristics of the sensor measurement signal, the controller circuit 102 may determine a speed of the electric motor 210, and display the speed on the display 106. For example, the controller circuit 102 may display a numerical value corresponding to the speed of the electric motor 210 based on the sensor measurement signal generated by the TMSS 122.

The controller circuit 102 may determine whether the speed on the display 106 is approximately the same as and/or within a predetermined threshold with the first speed. For example, the controller circuit 102 may compare the first speed with the speed based on the sensor measurement signal generated by the TMSS 122. The controller circuit 102 may generate a display indicator based on the measured speed of the electric motor 210. For example, the controller circuit 102 may display a flashing indicator when the measured speed of the electric motor 210 is not the same and/or approximate to (e.g., within a predetermined threshold) the first speed.

Optionally, the portable TMSS testing device 200 may simulate vibrations and/or motion of the propulsion-generating vehicle 100, as described above, by continually changing and/or shifting a position of the portable TMSS testing device 200 with respect to the propulsion-generating vehicle 100.

If the first speed is displayed, then at 722, the portable TMSS testing device 200 is adjusted to the second speed. For example, the operator may adjust a rotational position of the user interface device 212 to a maximum speed of the portable TMSS testing device 200. In one aspect, the maximum speed may be a rotational position of the dial rotatable corresponding to an unadjusted voltage and/or current supplied to the electric motor 210 from the power source 204 or voltage regulator 206. For example, the power source 204 may correspond to a 12 V rechargeable battery. When the user interface device 212 is adjusted to the maximum speed (e.g., the second speed), the electric motor 210 is supplied approximately 12 V from the power source 204.

At 724, the controller circuit 102 may determine whether the second speed is displayed in the propulsion-generating vehicle 100. In operation, the TMSS 122 may generate a sensor measurement signal having one or more electrical characteristics (e.g., voltage, current, amplitude, frequency, phase, and/or the like) representing the measured speed of the electric motor 210. The sensor measurement signal may be received by the measuring circuitry of the controller circuit 102 via the sensor cable 412. Based on the one or more electrical characteristics of the sensor measurement signal, the controller circuit 102 may determine a speed of the electric motor 210, and display the speed on the display 106. For example, the controller circuit 102 may display a numerical value corresponding to the speed of the electric motor 210 based on the sensor measurement signal generated by the TMSS 122.

The controller circuit 102 may determine whether the speed on the display 106 is approximately the same as and/or within a predetermined threshold with the second speed. For example, the controller circuit 102 may compare the second speed with the speed based on the sensor measurement signal generated by the TMSS 122. The controller circuit 102 may generate a display indicator based on the measured speed of the electric motor 210. For example, the controller circuit 102 may display a flashing indicator when the measured speed of the electric motor 210 is not the same and/or approximate to (e.g., within a predetermined threshold) the second speed.

If the first speed or the second speed was not displayed, then at 720 the TMSS 122 can be replaced. For example, since the measuring circuitry of the controller circuit 102 is known to operate and/or function correctly based on the operations 702-706 and 710-712, the TMSS 122 is a variable component. Thereby, the TMSS 122 may be determined to be the cause of the TMSS fault and/or malfunction.

At 726, the traction motor 109 of the propulsion-generating vehicle 100 can be replaced. For example, since the measuring circuitry of the controller circuit 102 and the TMSS 122 is known to operate and/or function correctly based on the operations 702-706, 710-718, and 722-724 the traction motor 109 is a variable component. Thereby, the traction motor 109 may be determined to be the cause of the TMSS fault and/or malfunction.

In one embodiment, a system (e.g., a portable testing device) includes a housing that encloses an electric motor and a power source. The power source is configured to provide electrical power to the electric motor. The system also includes a sensor port operatively coupled to the housing and the electric motor. The sensor port includes a converter member that is movable to adjust a depth of the sensor port. The system also includes a user interface device operatively coupled to the housing. The user interface device is configured to adjust an amount of the electrical power provided by the power source to the electric motor. The sensor port is configured to removably receive a sensor for testing operation of the sensor relative to the electric motor.

Optionally, the converter member may include a series of notches or holes configured to receive a head of a sensor cable may include the sensor. Additionally or alternatively, the head may enclose the sensor, the sensor including a speed sensor configured to measure a speed of the electric motor. Optionally, the depth of the sensor port may be configured to be adjusted to establish a position of the speed sensor relative to the portable testing device when the head of the sensor cable is received in the sensor port. In one aspect, the speed sensor may be one of an alternating current traction motor speed sensor or a direct current traction motor speed sensor. Optionally, the depth of the sensor ports may be configured to be adjusted to position the speed sensor adjacent to the electric motor when the sensor port receives the head. Additionally, or alternatively, the series of notches or holes may be positioned on the converter member to correspond to positions of plural mounting studs and a central peg on the head.

Optionally, the converter member may be configured to rotate about a pivot to an up position or a down position.

Optionally, the system includes an attachment for carrying the housing.

Optionally, the user interface may include a rotatable dial.

In one embodiment, a system includes a portable testing device having an electric motor, a power source, a housing, and a user interface device. The power source is configured to provide electrical power to the electric motor. The electric motor and the power source are enclosed in the housing. The housing includes a sensor port, and the user interface device attached to the housing. The sensor port is operatively coupled to the electric motor, and is configured to removably receive a sensor for testing operation of the sensor relative to the electric motor. The sensor port having converter member that is configured to adjust a depth of the sensor port to establish a position of the sensor relative to the testing device when the sensor is received in the sensor port. The user interface device is configured to adjust an amount of electrical power provided by the power source to the electric motor.

Optionally, the depth of the sensor port may be configured to be adjusted to a first depth length when the sensor is an alternating current traction motor speed sensor and to a second depth length when the sensor is a direct current traction motor speed sensor.

Optionally, the converter member may be configured to rotate about a pivot to an up position or a down position.

Optionally, the portable testing device may include an attachment for carrying the housing.

Optionally, the sensor may include a speed sensor that is operatively coupled to a propulsion-generating vehicle.

Optionally, the sensor may generate a sensor measurement signal that may include one or more electrical characteristics corresponding to a speed of the electric motor.

Optionally, the sensor may be one of an alternating current traction motor speed sensor or a direct current traction motor speed sensor.

Optionally, the converter member may include a series of notches or holes configured to receive a head of a sensor cable.

In one embodiment, a method includes moving a converter member to adjust a depth of a sensor port to receive a head of a sensor cable. A speed sensor is attached to the head of the sensor cable. The method also includes inserting the head into the sensor port to position the speed sensor to a measurement position, which is adjacent to an electric motor. The measurement position is established by the depth of the sensor port. The method further includes adjusting a speed of the electric motor by adjusting an electric power delivered to the electric motor by a power source. The electric motor and the power source are enclosed in a housing. The method also includes measuring a speed of the electric motor by the speed sensor.

Optionally, the method may include adjusting a position of a portable testing device when measuring the speed of the electric motor. The portable device may include the housing, the electric motor, the power source, and a user interface device configured to adjust the electric power delivered to the electric motor by the power source.

As used herein, the terms "module", "system," "device," or "unit," may include a hardware and/or software system and circuitry that operates to perform one or more functions. For example, a module, unit, device, or system may include a computer processor, controller, or other logic-based device that performs operations based on instructions stored on a tangible and non-transitory computer readable storage medium, such as a computer memory. Alternatively, a module, unit, device, or system may include a hard-wired device that performs operations based on hard-wired logic and circuitry of the device. The modules, units, or systems shown in the attached figures may represent the hardware and circuitry that operates based on software or hardwired instructions, the software that directs hardware to perform the operations, or a combination thereof. The modules, systems, devices, or units can include or represent hardware circuits or circuitry that include and/or are connected with one or more processors, such as one or computer microprocessors.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein are intended to define the parameters of the inventive subject matter, they are by no means limiting and are exemplary embodiments. Many other embodiments will be apparent to one of ordinary skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose several embodiments of the inventive subject matter, including the best mode, and also to enable one of ordinary skill in the art to practice the embodiments of inventive subject matter, including making and using any devices or systems and performing any incorporated methods. The patentable scope of the inventive subject matter is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

The foregoing description of certain embodiments of the present inventive subject matter will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, processors or memories) may be implemented in a single piece of hardware (for example, a general purpose signal processor, microcontroller, random access memory, hard disk, or the like). Similarly, the programs may be stand alone programs, may be incorporated as subroutines in an operating system, may be functions in an installed software package, or the like. The various embodiments are not limited to the arrangements and instrumentality shown in the drawings.

As used herein, an element or step recited in the singular and proceeded with the word "a" or "an" should be understood as not excluding plural of said elements or operations, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "comprises," "including," "includes," "having," or "has" an element or a plurality of elements having a particular property may include additional such elements not having that property.

What is claimed is:

1. A portable testing device comprising:
    a housing that encloses an electric motor and a power source, wherein the power source is configured to provide electrical power to the electric motor;
    a sensor port operatively coupled to the housing and the electric motor, the sensor port having a converter member that is moveable to adjust a depth of the sensor port; and
    a user interface device operatively coupled to the housing, the user interface device configured to adjust an amount of the electrical power provided by the power source to the electric motor,
    wherein the sensor port is configured to removably receive a sensor for testing operation of the sensor relative to the electric motor; and
    wherein the testing device is portable to be hand carried by an operator.

2. The portable testing device of claim 1, wherein the converter member includes a series of notches or holes configured to receive a head of a sensor cable that includes the sensor.

3. The portable testing device of claim 2, wherein the head encloses the sensor, the sensor comprising a speed sensor configured to measure a speed of the electric motor.

4. The portable testing device of claim 3, wherein the depth of the sensor port is configured to be adjusted to establish a position of the speed sensor relative to the portable testing device when the head of the sensor cable is received in the sensor port.

5. The portable testing device of claim 3, wherein the speed sensor is one of an alternating current traction motor speed sensor or a direct current traction motor speed sensor.

6. The portable testing device of claim 3, wherein the depth of the sensor port is configured to be adjusted to position the speed sensor adjacent to the electric motor when the sensor port receives the head.

7. The portable testing device of claim 2, wherein the series of notches or holes are positioned on the converter member to correspond to positions of plural mounting studs and a central peg on the head.

8. The portable testing device of claim 1, wherein the converter member is configured to rotate about a pivot to an up position or a down position.

9. The portable testing device of claim 1, further comprising an attachment for carrying the housing.

10. The portable testing device of claim 1, wherein the user interface device includes a rotatable dial.

11. A system comprising:
    a testing device having an electric motor, a power source, a housing, and a user interface device, wherein the power source is configured to provide electrical power to the electric motor, the electric motor and the power source are enclosed in the housing, the housing having a sensor port, and the user interface device is attached to the housing, the sensor port is operatively coupled to the electric motor and is configured to removably receive a sensor for testing operation of the sensor relative to the electric motor, the sensor port having a converter member that is configured to adjust a depth of the sensor port to establish a position of the sensor relative to the testing device when the sensor is received in the sensor port, and the user interface device is configured to adjust an amount of the electrical power provided by the power source to the electric motor, wherein the testing device is portable to be hand carried by an operator.

12. The system of claim 11, wherein the depth of the sensor port is configured to be adjusted to a first depth length when the sensor is an alternating current traction motor speed sensor and to a second depth length when the sensor is a direct current traction motor speed sensor.

13. The system of claim 11, wherein the converter member is configured to rotate about a pivot to an up position or a down position.

14. The system of claim 11, wherein the portable testing device includes an attachment for carrying the housing.

15. The system of claim 11, wherein the sensor comprises a speed sensor that is operatively coupled to a propulsion-generating vehicle.

16. The system of claim 11, wherein the sensor generates a sensor measurement signal that includes one or more electrical characteristics corresponding to a speed of the electric motor.

17. The system of claim 11, wherein the sensor is one of an alternating current traction motor speed sensor or a direct current traction motor speed sensor.

18. The system of claim 11, wherein the converter member includes a series of notches or holes configured to receive a head of a sensor cable.

19. A method comprising:
    moving a converter member of a testing device to adjust a depth of a sensor port to receive a head of a sensor cable, wherein a speed sensor is attached to the head of the sensor cable, and wherein the testing device is portable to be hand carried by an operator;
    inserting the head into the sensor port to position the speed sensor to a measurement position adjacent to an electric motor of the testing device, wherein the measurement position is established by the depth of the sensor port;
    adjusting a speed of the electric motor by adjusting an electric power delivered to the electric motor by a power source, wherein the electric motor and the power source are enclosed in a housing; and
    measuring a speed of the electric motor by the speed sensor.

20. The method of claim 19, further comprising adjusting a position of the portable testing device when measuring the speed of the electric motor, the portable testing device comprising the housing, the electric motor, the power source, and a user interface device configured to adjust the electric power delivered to the electric motor by the power source.

\* \* \* \* \*